US009899555B2

(12) United States Patent
Ring et al.

(10) Patent No.: US 9,899,555 B2
(45) Date of Patent: Feb. 20, 2018

(54) METHOD FOR PRODUCING A REAR-SIDE CONTACT SYSTEM FOR A SILICON THIN-LAYER SOLAR CELL

(71) Applicant: Helmholtz-Zentrum Berlin fuer Materialien und Energie GmbH, Berlin (DE)

(72) Inventors: Sven Ring, Berlin (DE); Moshe Weizman, Berlin (DE); Holger Rhein, Berlin (DE); Christof Schultz, Berlin (DE); Frank Fink, Potsdam (DE); Stefan Gall, Berlin (DE); Rutger Schlatmann, Berlin (DE)

(73) Assignee: HELMHOLTZ-ZENTRUM BERLIN FUER MATERIALIEN UND ENERGIE GMBH, Berlin (DE)

( * ) Notice: Subject to any disclaimer, the term of this patent is extended or adjusted under 35 U.S.C. 154(b) by 0 days.

(21) Appl. No.: 15/327,385

(22) PCT Filed: Jul. 21, 2015

(86) PCT No.: PCT/DE2015/100309
§ 371 (c)(1),
(2) Date: May 8, 2017

(87) PCT Pub. No.: WO2016/012007
PCT Pub. Date: Jan. 28, 2016

(65) Prior Publication Data
US 2017/0236965 A1     Aug. 17, 2017

(30) Foreign Application Priority Data

Jul. 22, 2014  (DE) ................. 10 2014 110 262

(51) Int. Cl.
*H01L 21/00* (2006.01)
*H01L 31/061* (2012.01)
(Continued)

(52) U.S. Cl.
CPC ...... *H01L 31/061* (2013.01); *H01L 31/02167* (2013.01); *H01L 31/022475* (2013.01);
(Continued)

(58) Field of Classification Search
None
See application file for complete search history.

(56) References Cited

U.S. PATENT DOCUMENTS

| 4,959,119 A | 9/1990 | Lantzer |
| 5,538,564 A | 7/1996 | Kaschmitter |

(Continued)

FOREIGN PATENT DOCUMENTS

| DE | 69012517 T2 | 3/1995 |
| DE | 19915666 A1 | 10/2000 |

(Continued)

OTHER PUBLICATIONS

M. Weizman, et al., "Efficiency and stability enhancement of laser-crytallized polycrystalline silicon thin-film solar cells by laser firing of the absorber contacts", Solar Energy Materials and Solar Cells, vol. 120, part B, Jan. 2014, pp. 521-525.

(Continued)

*Primary Examiner* — Bradley K Smith
(74) *Attorney, Agent, or Firm* — Leydig, Voit & Mayer, Ltd.

(57) ABSTRACT

A method for producing a rear-side contact system for a silicon thin-film solar cell having a pn junction formed from a silicon absorber layer and an emitter layer includes applying an organic insulation layer to the emitter layer; producing contact holes in the insulation layer as far as the absorber layer and the emitter layer; subsequently insulating the contact holes; subsequently applying a low-melting metal layer to form n and p contacts in the contact holes; separating the metal layer into n-contacting and p-contacting (Continued)

regions by laser-cutting; before applying the organic insulation layer to the emitter layer, applying a TCO layer; producing holes for contacts for the silicon absorber layer in the organic insulation; and subsequently selectively doping the produced holes for the contacts as far as the silicon absorber layer.

12 Claims, 2 Drawing Sheets

(51) Int. Cl.
*H01L 31/18* (2006.01)
*H01L 31/0445* (2014.01)
*H01L 31/0216* (2014.01)
*H01L 31/0224* (2006.01)
*H01L 31/0376* (2006.01)
*H01L 31/0368* (2006.01)

(52) U.S. Cl.
CPC ........ *H01L 31/022483* (2013.01); *H01L 31/03682* (2013.01); *H01L 31/03762* (2013.01); *H01L 31/0445* (2014.12); *H01L 31/1864* (2013.01); *H01L 31/1868* (2013.01); *H01L 31/1872* (2013.01); *H01L 31/1884* (2013.01)

(56) References Cited

U.S. PATENT DOCUMENTS

| 7,585,781 B2 | 9/2009 | Young et al. |
| 2006/0130891 A1 | 6/2006 | Carlson |
| 2011/0126886 A1 | 6/2011 | Stangl et al. |
| 2017/0200850 A1* | 7/2017 | Lee .................... H01L 31/0368 |
| 2017/0236954 A1* | 8/2017 | Kramer .......... H01L 31/022458 136/256 |

FOREIGN PATENT DOCUMENTS

| DE | 10005330 A1 | 9/2001 |
| DE | 102007051725 A1 | 5/2009 |
| DE | 102009057881 A1 | 6/2011 |
| DE | 102014110262 A1 | 1/2016 |
| WO | WO 03019674 A1 | 3/2003 |
| WO | WO 2005024927 A1 | 3/2005 |
| WO | WO 2008102172 A1 | 8/2008 |
| WO | WO 2010012259 A2 | 2/2010 |

OTHER PUBLICATIONS

M.A. Green, et al., "Crystalline silicon on glass (CSG) thin-film solar cell modules", Solar Energy, vol. 77, issue 6, Dec. 2004, pp. 857-863.

* cited by examiner

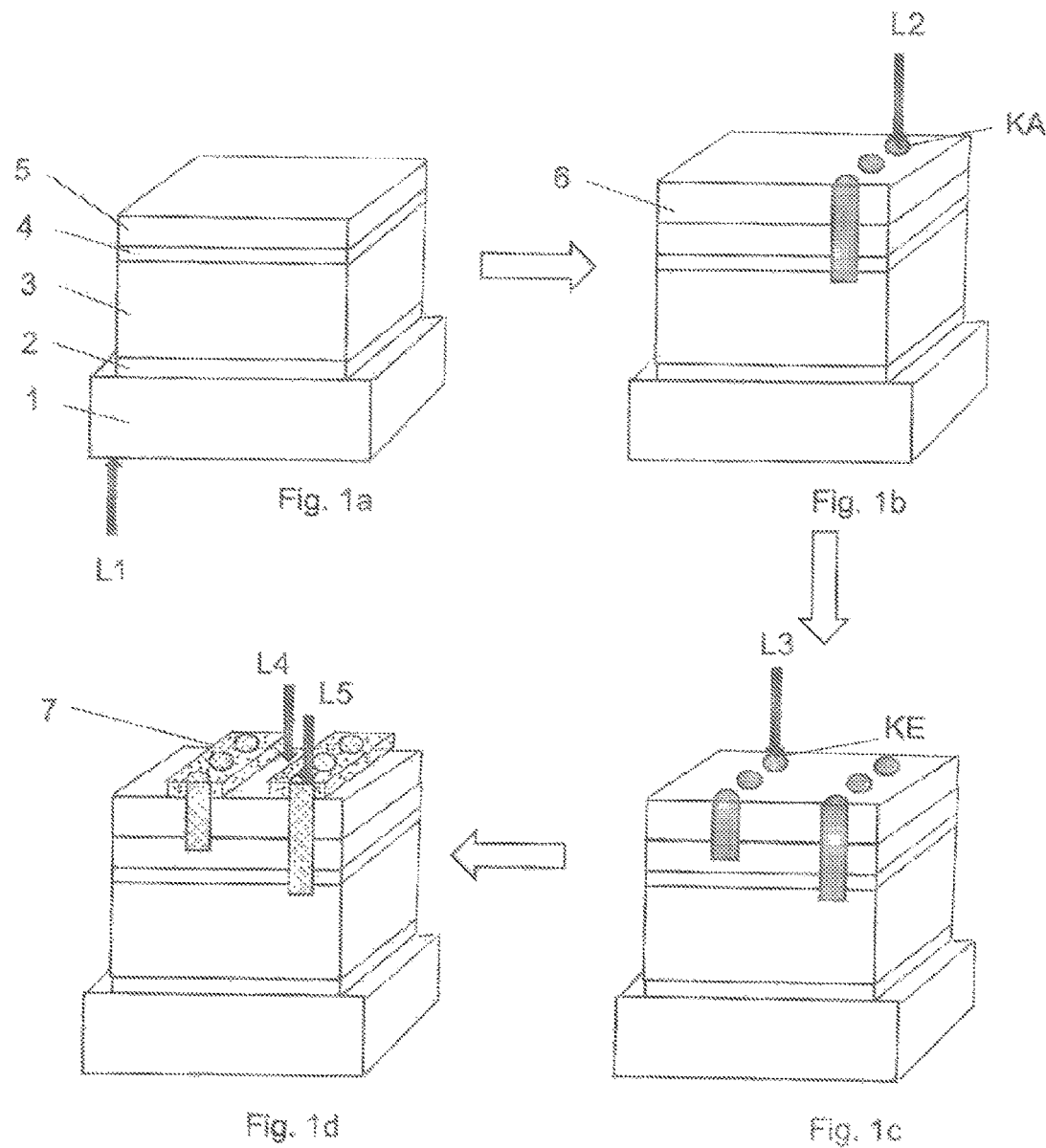

METHOD FOR PRODUCING A REAR-SIDE CONTACT SYSTEM FOR A SILICON THIN-LAYER SOLAR CELL

CROSS REFERENCE TO RELATED APPLICATIONS

This application is a U.S. National Stage Application under 35 U.S.C. § 371 of International Application No. PCT/DE2015/100309 filed on Jul. 21, 2015, and claims benefit to German Patent Application No. DE 10 2014 110 262.2 filed on Jul. 22, 2014. The International Application was published in German on Jan. 28, 2016 as WO 2016/012007 A1 under PCT Article 21(2).

FIELD

The invention relates to a method for producing a rear-side contact system for a silicon thin-film solar cell having a pn junction formed from a silicon absorber layer and an emitter layer.

BACKGROUND

Methods known in the prior art for rear-side contacting wafer-based silicon solar cells are based on lithography, masking, and "lift-off" methods but are not suitable for industrial implementation for large-area application to thin-film solar cells because of the complexity, the handling outlay, and the low achievable machining speeds.

By contrast, the use of lasers for producing contact systems is suitable for producing large-area thin-film solar cells. Various process steps such as removing material in the form of points or lines, material alterations or laser doping by firing contacts are known in the prior art.

For example, in U.S. Pat. No. 5,538,564 A, p and n contacts having a high aspect ratio are produced in the active layer of a solar cell by doping using a pulsed laser in a gas atmosphere containing the dopant. This laser may be selected from the group of excimer, dye or YAG lasers.

A further important step for producing a rear-side contacting system for thin-film solar cells involves contact structures produced using the laser, including in particular holes in an insulation layer made in a rear side, which are required for connecting metal contacts and active solar cell layers. DE 690 12 517 T2 discloses a method for forming through-holes in a polyimide substrate, in which method holes are produced in a polyimide substrate in an oxygen-containing atmosphere using a defocused carbon dioxide laser of a defined energy density, and polyimide residues are removed by subsequent chemical etching. This publication makes reference to other known methods of laser drilling. Thus, in the case of the excimer laser, photodecomposition using electromagnetic energy in the UV range of the spectrum is used so as to break the chemical bonds in the substrate and decompose the polyimide. Using an argon ion laser, electromagnetic energy of this type is introduced into the polyimide substrate, and damages but does not decompose the film. This is followed by an etching step using plasma, so as to remove the polyimide damaged by the radiation. However, this etching step produces holes having different diameters or deviant hole shapes, and this is undesirable. If the holes are "drilled" using a carbon dioxide laser, this results in considerable amounts of residues in the form of ablated particles, which would have to be removed again by way of an etching step.

In the method disclosed in DE 100 05 330 A1 for producing high-resolution transparent and conductive structures, laser radiation acts on selected regions of a non-transparent, non-conductive layer, converting the material in the irradiated regions into transparent, conductive material. Once the conversion into a transparent material is complete, the laser radiation can also act on deeper layer regions. After the action of the laser radiation, there are transparent, conductive regions and non-transparent, insulating regions, which have different etching properties, in other words are affected to different extents, resulting in structuring.

In the method disclosed in DE 10 2007 051 725 A1 for contacting solar cells, a masking layer is opened to form narrow structures using laser radiation. If the substrate surface is damaged in this process, the recombination of generated charge carriers is increased there. To remove damage of this type, the surface is subjected to wet-chemical or plasma etching.

DE 199 15 666 A1 discloses a method for selectively contacting solar cells, in particular for contacting the emitter layer and/or base layer of the solar cell. In this method, a laser beam is directed onto an array of optical micro-lenses, the focal points of which are positioned in the region of a dielectric layer that covers the surface of the solar cell to be electrically contacted. At the focal points, material is removed as a result of the exposure until the surface to be electrically contacted has been uncovered there. Subsequently, the uncovered surface is metallized through the dielectric layer.

In DE 10 2009 057 881 A1, too, structures are produced using laser radiation. Here, an absorber layer that absorbs laser radiation is applied to a layer transparent to laser radiation. Local regions in the absorber layer are removed using laser radiation; subsequently, the now uncovered regions of the transparent layer are removed by means of an etching step.

WO 03/019674 A1 discloses directly producing contact holes through a layer or a plurality of layers as far as into the emitter layer or absorber layer using laser drilling, on the entire surface of a solar cell module, in connection with a series connection of the solar cells in a module. In this case, one layer is an insulating layer formed from two sub-layers, one sub-layer in turn being a synthetic resin layer.

WO 2010/012259 A2 discloses producing a heterocontact silicon thin-film solar cell in which the contacts for the emitter and the absorber reach different depths and extend in holes having lateral insulation, and the contacts may consist of TCO layers.

A method for producing a rear-side contact for polycrystalline thin-film solar cells was disclosed by M. Green et al. in Solar Energy 77, 2004, pp. 857-863. On an insulating synthetic resin layer, in a two-step process, an etching solution is applied in succession by inkjet printing to the locations at which the contact holes are to be produced as far as the absorber layer or as far as the emitter layer by etching. U.S. Pat. No. 7,585,781 B2 explains this method in detail; in particular, the insulation of the uncovered edges of the emitter layer by a "reflow" process of the material of the insulation layer is disclosed. The invention starts from this prior art. For completeness, reference should be made to the WO application having publication number WO 2005/024927 A1, on which the US patent is based and in which an organic insulation layer is also removed, inter alia, by laser ablation, before holes are etched as far as into the silicon absorber layer. However, the document also discloses the use of photographic techniques in which no laser is used.

SUMMARY

In an embodiment, the present invention provides a method for producing a rear-side contact system for a silicon thin-film solar cell having a pn junction formed from a silicon absorber layer and an emitter layer. The method includes applying an organic insulation layer to the emitter layer, producing contact holes in the insulation layer as far as the absorber layer and the emitter layer, subsequently insulating the contact holes, subsequently applying a low-melting metal layer to form n and p contacts in the contact holes, separating the metal layer into n-contacting and p-contacting regions by laser-cutting, before applying the organic insulation layer to the emitter layer, applying a TCO layer, producing holes for contacts for the silicon absorber layer in the organic insulation layer by initially producing first markings in the organic insulation layer using a pulsed UV laser at future locations of the contacts for the silicon absorber layer without removing the material all the way through and subsequently etching the first markings in at least one first wet-chemical, selective, etching step, initially as far as the TCO layer and then, in a further etching step, through the emitter layer into the silicon absorber layer, subsequently producing second markings in the organic insulation layer using a pulsed UV laser without removing the material all the way through and etching the second markings as far as the TCO layer in a second wet-chemical, selective etching step, and subsequently selectively doping the produced holes for the contacts as far as the silicon absorber layer.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIGS. 1a through 1d schematically show the sequence of individual method steps of a method according to an embodiment of the invention;

DETAILED DESCRIPTION

Figure 2A:
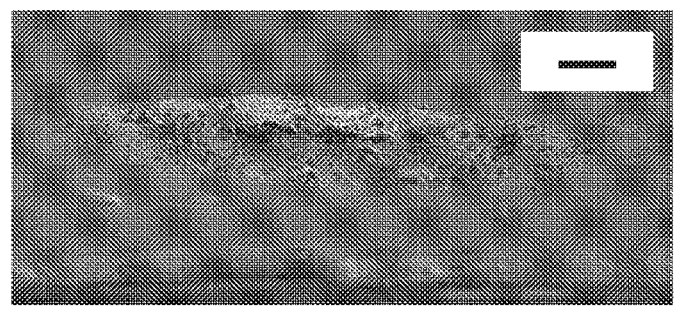
FIG. 2a shows a scanning electron microscope image of a laser marking in a lacquer coat according to an embodiment of the invention.

A method for producing a rear-side contact system for a silicon thin-film solar cell that ensures high precision of positioning and reliability, is scalable, and avoids damage to the emitter layer is described herein. The method described herein is intended to be well suited to in a unitary production process for thin-film solar cells.

According to a method of embodiments of the invention, before applying the organic insulation layer to the emitter layer, a TCO layer is applied. Holes for the contacts for the silicon absorber layer in the insulation layer are produced in that markings are initially made in the organic insulation layer using a pulsed UV laser at future locations of the contacts for the silicon absorber layer, without removing the material all the way through. These markings are subsequently opened, in at least one wet-chemical, selective, large-area etching step, through the emitter layer as far as into the silicon absorber layer. Subsequently, holes for the contacts for the emitter layer are produced in the insulation layer in that markings are again made using a pulsed UV laser at future locations of the contacts for the emitter layer, and subsequently opened as far as the TCO layer in a wet-chemical, selective, large-area etching step. It should be noted that all etching steps in the method according to the invention are carried out over a large area, by contrast with the prior art for producing point contacts, and are thus simpler to perform.

The method according to embodiments of the invention, in which the contact holes through the organic insulation layer, in each case for the emitter or absorber layer, are each produced by laser marking and a subsequent etching step, is more reliable and more precise than the inkjet printing of the contact holes that is known from the prior art. The use of a laser in the method according to the invention also simplifies using said method in later, subsequent method steps without orientation/positioning difficulties—for example for doping the point contacts for the absorber layer by "laser firing." It is thus possible to carry out all structuring steps or local material machining for producing a point contact system—starting with individuating the solar cells—using a laser. Therefore, a contact system produced in accordance with the method according to the invention is an "all-by-laser point-contact scheme" (ALPS).

A further advantage of the method according to embodiments of the invention is found in the application thereof to hetero thin-film solar cells, the band gap of the two materials forming the heterojunction being different, and the thin amorphous emitter of a hetero thin-layer solar cell of this type reacting substantially more sensitively to laser-induced heat than the emitter of a homojunction solar cell, a homojunction of this type being understood to be a junction consisting of a p-conducting and an n-conducting material having the same band gap. As a result of the low laser fluence, at which the contact holes are not actually completely opened in the method according to the invention, and the arrangement of an etching blocking layer, the emitter is protected from damage.

One embodiment provides that the pulsed UV laser for producing the markings in the insulation layer, without removing the material all the way through, for forming the contact holes for the absorber and emitter layer has an accumulated laser fluence of from 5 J/cm$^2$ to 50 J/cm$^2$. The value of the laser fluence is dependent, inter alia, on the layer thickness, the ambient temperature, the composition of the layer materials and the pulse duration and wavelength of the laser used.

The use of an IR laser or a laser in the visible wavelength range is also possible so as to make the markings for the contact holes in the organic insulation layer.

One embodiment of the invention provides that aluminum-doped ZnO or ITO at a thickness of from 50 nm to 500 nm is used as the material for the TCO layer that is used as an etching blocking layer.

In another embodiment, a polycrystalline silicon layer, recrystallized by laser or by electron beam, at a thickness of from 2 µm to 40 µm is used as the silicon absorber layer. In this case, the beam profile both of the laser and of the electron beam is linear, so as to make recrystallization possible over as large an area as possible.

The following embodiments relate to the emitter layer, for which an amorphous silicon layer at a thickness of from 5 nm to 50 nm or a polycrystalline silicon layer at a thickness of from 0.1 μm to 2 μm is used. An organic material for forming the emitter layer may also be used, since as—stated previously—the emitter layer is protected from damage during the method according to the invention as a result of the low laser fluence, at which the contact holes are not actually completely opened in the method according to the invention, and as a result of the arrangement of an etching blocking layer.

Embodiments for the absorber layer are as follows: In a first embodiment, p-conducting silicon is used, and aluminum laser firing is carried out as a method step for selectively doping the absorber contact holes. A second embodiment in this regard provides using n-conducting silicon as the material for the absorber layer and using phosphorous or antimony laser firing as a method step for selectively doping the absorber contact holes. Either the dopants may be deposited together with the silver used as a conductive layer, or a layer containing these substances is applied to a previously deposited silver layer and subsequently fired.

Using the at least one wet-chemical, selective etching step, in another embodiment the laser markings for forming the contact holes for the silicon absorber layer and for the emitter layer are initially opened in the organic insulation layer. An approximately 1.5% KOH solution is used, and acts on the laser markings over a period of one to 10 min.

In a further embodiment, the TCO layer, opened by the at least one wet-chemical, selective etching step, in the regions of the laser markings is completely removed using an HF solution in the at least one further etching step, and subsequently the emitter layer, which is thus exposed, is etched to the required depth using $KMnO_4$ in HF solution.

In a further embodiment, a white lacquer coat is used for the organic insulation layer applied to the emitter layer, and simultaneously serves as a reflection layer. This lacquer coat may for example be applied by spray-coating, dip-coating or screen printing methods.

In another embodiment, an intrinsic amorphous Si layer is arranged between the Si absorber layer and the emitter layer as a passivation layer.

The starting point is a layer arrangement having a 10 μm thick, planar, polycrystalline p-Si absorber layer 2 (band gap: 1.1 eV), deposited by PECVD or electron beam evaporation and subsequently recrystallized by laser or electron beam, on a glass substrate 1 (thickness 3.3 mm), said absorber layer being passivated using a 13 nm thick i-a-Si layer 3, on which a 13 nm thick, n-doped a-Si emitter layer 4 (band gap of the emitter layer: 1.8 eV), having an Al-doped ZnO layer 5 of a thickness of 300 nm applied thereto, is arranged.

For method steps that are then to be carried out according to an embodiment of the invention on this layer arrangement using a laser, a pulsed Nd doped vanadate ns laser ($\lambda$=532 nm) and a Nd-doped YAG ps solid-state laser ($\lambda$=1064 nm, 355 nm) are used.

In the first method step, the size of the solar cell is defined by inscribing insulation lines L1 using an IR ps laser (pulse fluence of approximately 3.9 $J/cm^2$ and spot overlap of approximately 80%) from the substrate side (FIG. 1a). Subsequently, a 5 μm thick, white lacquer coat 6—in this example Novolac 150 in a mixture with $TiO_2$ nanoparticles (ratio 5:1)—is applied to the ZnO:Al layer 5 by rotational coating, and the contact holes KA for the absorber layer 3 are marked L2 by means of a UV ps laser. Here, the laser has an accumulated laser fluence of approximately 20 $J/cm^2$ for the given thickness of the lacquer coat and the laser arrangement used. In a follow-up step, these marked regions in the lacquer coat 6 are subjected to wet-chemical opening as far as the ZnO:Al layer 5 using for example a 1.5% aqueous KOH solution. The further etching of the ZnO:Al layer 5 takes place using a 5% HF solution over approximately 60 s, and that of the emitter layer takes place using a 1% HF solution containing 0.01% $KMnO_4$ in solution, over approximately 10 s (FIG. 1b). Subsequently, the contact holes KE for the emitter layer 4 are in turn marked by means of a UV ps laser L3 and approximately 20 $J/cm^2$ accumulated laser fluence, followed by a further (KOH) etching step—as described above—that opens the lacquer layer as far as the ZnO:Al layer 5. In this state, the layer arrangement is introduced into a vapor atmosphere of a solvent, causing the lacquer of the layer 6 to become soft and to flow into the contact holes KA, KE over the edges thereof (not shown in the drawing). The emitter layer 4 is thus insulated with respect to the contact holes KA for the absorber layer 3 passing through it (FIG. 1c). In a subsequent method step, a 100 nm thick aluminum layer 7 is applied to the entire surface of the lacquer coat 6 provided with contact holes KA, KE. Said aluminum layer is subsequently separated into regions having contact holes KE for the emitter layer 4 and regions having contact holes KA for the absorber layer 3 by laser cutting L4 using a UV laser on the relevant cell (FIG. 1d). In this way, a cell-overlapping series connection can be produced. The last shown method step carried out using a laser illustrates doping L5 the absorber contact holes KA with aluminum using an ns laser (also FIG. 1d).

FIG. 2a, an SEM image, shows a marked circle produced in the lacquer coat using a ps UV laser (at an accumulated laser fluence of approximately 20 $J/cm^2$). For size comparison, a line of 10 μm is shown in the same image.

Figure 2B:
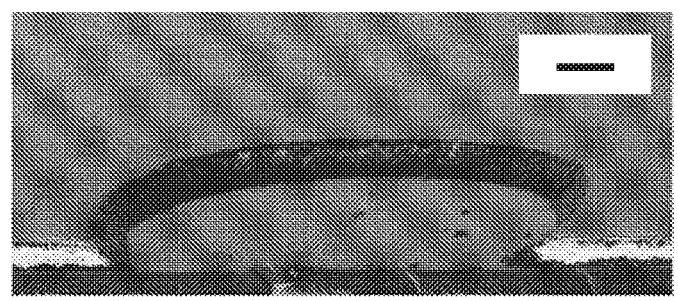
FIG. 2b shows a scanning electron microscope image after the marking of FIG. 2a is etched in the lacquer coat.

FIG. 2b shows this part of the layer after the KOH etching step. It can be seen that the marked region for the contact hole has been removed.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 1 substrate
2 insulating layer

3 Si absorber layer
4 emitter layer
5 ZnO:Al layer
6 lacquer coat
7 Al layer
KA absorber contact holes
KE emitter contact holes
L1 laser-inscribing insulation lines
L2 laser-marking KA
L3 laser-marking KE
L4 laser-cutting the Al layer
L5 laser-doping the KA

The invention claimed is:

1. A method for producing a rear-side contact system for a silicon thin-film solar cell having a pn junction formed from a silicon absorber layer and an emitter layer, the method comprising:
applying an organic insulation layer to the emitter layer,
producing contact holes in the insulation layer as far as the absorber layer and the emitter layer,
subsequently insulating the contact holes,
subsequently applying a low-melting metal layer to form n and p contacts in the contact holes,
separating the metal layer into n-contacting and p-contacting regions by laser-cutting,
before applying the organic insulation layer to the emitter layer, applying a TCO layer,
producing holes for contacts for the silicon absorber layer in the organic insulation layer by initially producing first markings in the organic insulation layer using a pulsed UV laser at future locations of the contacts for the silicon absorber layer without removing the material all the way through and subsequently etching the first markings in at least one first wet-chemical, selective, etching step, initially as far as the TCO layer and then, in a further etching step, through the emitter layer into the silicon absorber layer,
subsequently producing second markings in the organic insulation layer using a pulsed UV laser without removing the material all the way through and etching the second markings as far as the TCO layer in a second wet-chemical, selective etching step, and
subsequently selectively doping the produced holes for the contacts as far as the silicon absorber layer.

2. The method for producing a rear-side contact system for a thin-film solar cell according to claim 1, wherein the pulsed UV laser for producing the first markings in the insulation layer without removing the material all the way through for forming the contact holes for the absorber layer and the emitter layer has a laser fluence of from 5 J/cm$^2$ to 50 J/cm$^2$.

3. The method for producing a rear-side contact system for a thin-film solar cell according to claim 1, wherein aluminum-doped ZnO or ITO at a thickness of from 50 nm to 500 nm is used as the material for the TCO layer.

4. The method for producing a rear-side contact system for a thin-film solar cell according to claim 1, wherein a polycrystalline silicon layer, recrystallized by a laser beam or by an electron beam, at a thickness of from 2 μm to 40 μm is used as the silicon absorber layer.

5. The method for producing a rear-side contact system for a thin-film solar cell according to claim 1, wherein an amorphous silicon layer at a thickness of from 5 nm to 50 nm is used as the emitter layer.

6. The method for producing a rear-side contact system for a thin-film solar cell according to claim 1, wherein a polycrystalline silicon layer at a thickness of from 0.1 μm to 2 μm is used as the emitter layer.

7. The method for producing a rear-side contact system for a thin-film solar cell according to claim 1, wherein p-conducting silicon is used as a material for the absorber layer, and wherein aluminum laser firing is carried out for selectively doping the absorber contact holes.

8. The method for producing a rear-side contact system for a thin-film solar cell according to claim 1, wherein n-conducting silicon is used as a material for the absorber layer, and wherein phosphorous or antimony laser firing is used for selectively doping the absorber contact holes.

9. The method for producing a rear-side contact system for a thin-film solar cell according to claim 1, wherein in the at least one wet-chemical, selective etching step, the laser markings for forming the contact holes for the silicon absorber layer and for the emitter layer are etched in an approximately 1.5% KOH solution over a period of one to 10 min.

10. The method for producing a rear-side contact system for a thin-film solar cell according to claim 1, wherein the TCO layer, opened by the at least one first wet-chemical, selective etching step, in the regions of the laser markings is completely removed using an HF solution in the at least one further etching step, and subsequently the emitter layer, which is thus exposed, is removed as far as the required depth using $KMnO_4$ in HF solution.

11. The method for producing a rear-side contact system for a thin-film solar cell according to claim 1, wherein a white lacquer coat is used for the organic insulation layer applied to the emitter layer, and wherein the white lacquer coat simultaneously serves as a reflection layer.

12. The method for producing a rear-side contact system for a thin-film solar cell according to claim 1, wherein an intrinsic amorphous Si passivation layer is arranged between the Si absorber layer and the emitter layer.

* * * * *